US008415675B2

(12) United States Patent
Im et al.

(10) Patent No.: US 8,415,675 B2
(45) Date of Patent: Apr. 9, 2013

(54) ORGANIC LIGHT EMITTING DISPLAY DEVICE AND METHOD OF FABRICATING THE SAME

(75) Inventors: Choong-Youl Im, Suwon-si (KR); Kyung-Jin Yoo, Suwon-si (KR); Woo-Sik Jun, Suwon-si (KR); Do-Hyun Kwon, Suwon-si (KR); Tae-Wook Kang, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1115 days.

(21) Appl. No.: 11/691,473

(22) Filed: Mar. 26, 2007

(65) Prior Publication Data
US 2007/0257253 A1 Nov. 8, 2007

(30) Foreign Application Priority Data

Mar. 27, 2006 (KR) .......................... 10-2006-0027661

(51) Int. Cl.
*H01L 27/32* (2006.01)
(52) U.S. Cl.
USPC ........... 257/72; 257/40; 257/59; 257/E27.119
(58) Field of Classification Search ..................... 257/40, 257/72
See application file for complete search history.

(56) References Cited

U.S. PATENT DOCUMENTS

| 6,476,988 B1* | 11/2002 | Yudasaka | 359/885 |
| 6,831,410 B2* | 12/2004 | Huang | 313/506 |
| 2001/0019133 A1* | 9/2001 | Konuma et al. | 257/79 |
| 2003/0080436 A1* | 5/2003 | Ishikawa | 257/776 |
| 2003/0193624 A1* | 10/2003 | Kobayashi et al. | 349/42 |
| 2003/0197466 A1* | 10/2003 | Yamazaki et al. | 313/504 |
| 2004/0066136 A1* | 4/2004 | Yoneda et al. | 313/505 |
| 2004/0224456 A1 | 11/2004 | Abe | |
| 2004/0239238 A1 | 12/2004 | Lee | |
| 2005/0046342 A1 | 3/2005 | Park et al. | |

(Continued)

FOREIGN PATENT DOCUMENTS

| CN | 1592520 A | 3/2005 |
| CN | 1703126 A | 11/2005 |

(Continued)

OTHER PUBLICATIONS

Patent Abstracts of Japan, Publication No. 2000-172198, Published on Jun. 23, 2000, in the name of Yamada.

(Continued)

*Primary Examiner* — Jenny L Wagner
*Assistant Examiner* — Mark Tornow
(74) *Attorney, Agent, or Firm* — Christie, Parker & Hale, LLP

(57) ABSTRACT

An organic light emitting display device and a method of fabricating the same are provided. A trench is formed in a planarization layer, and then a first electrode is formed to have opposite ends in the trench, thereby reducing a height difference between the planarization layer and the first electrode. That is, the thickness of a pixel defining layer formed on the first electrode may be reduced by reducing or minimizing protrusion of the first electrode with respect to the planarization layer. Thus, transfer efficiency can be increased when an organic layer is formed by a laser induced thermal imaging method, and reliability of a device can be improved by reducing or preventing thermal damage of the organic layer and open defects.

25 Claims, 6 Drawing Sheets

U.S. PATENT DOCUMENTS

| | | | |
|---|---|---|---|
| 2005/0057151 A1* | 3/2005 | Kuwabara | 313/506 |
| 2005/0082534 A1* | 4/2005 | Kim et al. | 257/72 |
| 2005/0093438 A1* | 5/2005 | Chen | 313/506 |
| 2005/0116630 A1* | 6/2005 | Kim et al. | 313/506 |
| 2005/0161667 A1 | 7/2005 | Konuma | |
| 2005/0264183 A1* | 12/2005 | Seo et al. | 313/504 |
| 2006/0139268 A1* | 6/2006 | Kobayashi | 345/87 |

FOREIGN PATENT DOCUMENTS

| | | |
|---|---|---|
| EP | 0 993 235 A2 | 4/2000 |
| JP | 5-21158 | 1/1993 |
| JP | 2000-172198 | 6/2000 |
| JP | 2000-260571 | 9/2000 |
| JP | 2003-084683 | 3/2003 |
| JP | 2003-203926 | 7/2003 |
| JP | 2003-317960 | 7/2003 |
| JP | 2005-331665 | 12/2005 |
| JP | 2005-334781 | 12/2005 |
| KR | 2000-0047776 | 7/2000 |
| KR | 2003-0074185 | 9/2003 |
| KR | 10-2004-0086551 | 10/2004 |
| KR | 10-2005-0022991 | 3/2005 |
| KR | 10-2005-0052291 | 6/2005 |
| KR | 10-2006-0038853 | 5/2006 |
| KR | 10-2006-0044256 | 5/2006 |

OTHER PUBLICATIONS

Korean Patent Abstracts, Publication No. 1020050052291 A, Published on Jun. 2, 2005, in the name of Park, et al.

Chinese Office action dated May 22, 2009, for corresponding Chinese application 200710091521.2, with English translation, as well as JP 2005-331665, previously filed in an IDS dated Nov. 23, 2007.

Korean Office action dated Apr. 23, 2007, for corresponding priority KR 10-20060027661 with English translation.

European Search Report dated Aug. 27, 2007, for EP 07104864.9, in the name of Samsung SDI Co., Ltd.

Patent Abstracts of Japan, Publication No. 05-021158, dated Jan. 29, 1993, in the name of Atsushi Sakurai.

Patent Abstracts of Japan, Publication No. 2000-260571, dated Sep. 22, 2000, in the name of Yasuo Segawa.

Patent Abstracts of Japan, Publication No. 2003-317960, dated Nov. 7, 2003, in the name of Ryoichi Nozawa.

Patent Abstracts of Japan, Publication No. 2005-331665, dated Dec. 2, 2005, in the name of Takahiro Iwashita.

Korean Patent Abstracts, Publication No. 1020000047776 A, dated Jul. 25, 2000, in the name of Tomu Yamadaz.

Korean Patent Abstracts, Publication No. 1020030074185 A, dated Sep. 19, 2003, in the name of Yukihiro Noguchi et al.

Korean Patent Abstracts, Publication No. 1020040086551 A, dated Oct. 11, 2004, in the name of Abe Hiroyuki.

Korean Patent Abstracts, Publication No. 1020050022991 A, dated Mar. 9, 2005, in the name of Jang Hyuk Kwon et al.

Korean Patent Abstracts, Publication No. 1020060038853 A, dated May 4, 2006, in the name of Jin Chul Moon.

Korean Patent Abstracts, Publication No. 1020060044256 A, dated May 16, 2006, in the name of Sang Il Park et al.

* cited by examiner

Related Art

ORGANIC LIGHT EMITTING DISPLAY DEVICE AND METHOD OF FABRICATING THE SAME

CROSS-REFERENCE TO RELATED APPLICATION

This application claims priority to and the benefit of Korean Patent Application No. 10-2006-0027661, filed Mar. 27, 2006, the entire content of which is incorporated herein by reference.

BACKGROUND OF THE INVENTION

1. Field of the Invention

The present invention relates to an organic light emitting display device and a method of fabricating the same.

2. Description of the Related Art

An organic light emitting (or organic electroluminescence) display device is a type of flat panel display device. In more detail, the organic light emitting display device is an emissive display device that electrically excites an organic compound in order to emit light. Organic light emitting display devices do not need a backlight as is used in liquid crystal displays (LCDs), and thus may be made to be relatively lightweight and slim, and have a relatively simple structure. Also, organic light emitting display devices may be fabricated at relatively low temperature and have characteristics such as a relatively high response time of 1 ms or less, a relatively low power consumption, a relatively wide viewing angle, and a relatively high contrast.

Organic light emitting display devices include an organic emission layer between an anode and a cathode, and holes supplied from the anode and electrons supplied from the cathode combine in the organic emission layer to form excitons which transition or decay (e.g., from an excited state or a ground state) to emit light.

Organic light emitting display devices can be classified into a bottom emission type and a top emission type according to a direction in which light generated in the organic emission layer is emitted. If an organic light emitting display device including a pixel driving circuit is the bottom emission type, an aperture ratio is limited because the pixel driving circuit occupies a large area of a substrate of the organic light emitting display device. Thus, the top emission type organic light emitting display device is introduced to improve the aperture ratio.

FIG. 1 is a cross-sectional view illustrating a structure of a conventional top emission type organic light emitting display device. Referring to FIG. 1, a buffer layer 110 is formed on a substrate 100 formed of glass or plastic. A thin film transistor is formed on the buffer layer 110 and includes a semiconductor layer 120 having source and drain regions 120a and 120c and a channel region 120b between the source and drain regions 120a and 120c, a gate insulating layer 130, and a gate electrode 140.

An interlayer insulating layer 150 is formed on the substrate 100 and on the thin film transistor. Then, contact holes 155 exposing parts of the source and drain regions 120a and 120c are formed in the interlayer insulating layer 150 and the gate insulating layer 130.

Source and drain electrodes 160a and 160b electrically connected with the source and drain regions 120a and 120c through the contact holes 155 are formed, and a planarization layer 170 is formed on the substrate 100 and on the source and drain electrodes 160a and 160b.

A via hole 175 exposing a part of the drain electrode 160b is formed in the planarization layer 170. A first electrode 180 contacting the drain electrode 160a through the via hole 175 is formed on the substrate 100 and on the planarization layer 170. The first electrode 180 may include a reflective metal layer 180a and a transparent conductive layer 180b such as an ITO layer formed on the reflective metal layer 180a.

In addition, a pixel defining layer 190 is formed on the first electrode 180. The pixel defining layer 190 is formed to a thickness from about 0.5 to 1 μm using an organic material (only), and then patterned to include an opening 200 for exposing the first electrode 180.

An organic layer is formed in the opening 200. The organic layer includes at least an organic emission layer, and may further include at least one of a hole injection layer, a hole transport layer, an electron transport layer, or an electron injection layer.

A second electrode is formed on the substrate 100 and on the organic layer to complete the formation of the top emission type organic light emitting display device display.

One method of fabricating the organic layer is to use a laser induced thermal imaging (LITI) method. When the organic layer is formed by the LITI method, if the pixel defining layer is formed to a thickness from about 0.5 to 1 μm as described above, there is a large height difference between the pixel defining layer and the first electrode, and thus the opening of the first electrode and a transfer layer of a donor substrate do not closely contact each other. Consequently, transfer energy becomes high, which may stimulate degradation of the organic layer, and the organic layer may not be properly transferred onto an edge part of the opening, which may result in an open defect. Thus, it is necessary to reduce the height difference between the pixel defining layer and the first electrode.

FIG. 2 is a photograph of an area surrounding a via hole after a pixel defining layer is formed to a thickness of 2000 Å using an organic material.

Referring to FIG. 2, in order to increase efficiency in fabricating an organic layer using an LITI method, a thin pixel defining layer was formed to a thickness of about 2000 Å using an organic material, for example, polyimide. The organic material, as illustrated with reference mark A, has a relatively good ability to fill the via hole. However, in order to form the pixel defining layer thinly, the pixel defining layer is formed by spin coating, and thus uniformity or dispersion is poor. As a result, an open defect may result around the via hole as illustrated with reference mark B. In addition, a protruding edge of a first electrode may not be fully covered, and may cause a short circuit between the first electrode and a second electrode. Moreover, since the pixel defining layer formed of the organic material does not have a rigid layer characteristic, it may tear during removal of a transfer layer of a donor substrate after the organic layer is formed on an opening of the first electrode. Thus, there is an additional possibility of a short circuit between the first and second electrodes.

FIG. 3 is a photograph of an area surrounding a via hole after a pixel defining layer is formed to a thickness of about 1000 Å using an inorganic material.

To overcome (or solve) the problems of the organic layer of FIG. 2, the pixel defining layer can be formed of an inorganic material, such as silicon nitride, that does not tear during removal of the transfer layer of the donor substrate after the organic layer is transferred due to its relatively high rigidity, and may be formed thinner than the organic layer of FIG. 2. However, as illustrated with reference mark C, the inorganic material has a poor ability to fill an inner via hole. Also, if the layer is increased in thickness, cracks may occur around the via hole (reference mark D) and a protruding edge of the first electrode due to stress, and thus a short circuit between the first and second electrodes may still occur.

SUMMARY OF THE INVENTION

An aspect of the present invention is directed to an organic light emitting display device which can increase (or maximize) transfer efficiency when an organic layer is formed by a laser induced thermal imaging (LITI) method and can prevent (or block) a short circuit between first and second electrodes, and a method of fabricating the same.

An aspect of the present invention is directed to an organic light emitting display and a method of fabricating the same, which can increase (or maximize) transfer efficiency in fabrication of an organic layer using a laser induced thermal imaging (LITI) method.

In an exemplary embodiment of the present invention, an organic light emitting display device includes: a substrate; a thin film transistor disposed on the substrate and including a semiconductor layer, a gate insulating layer, a gate electrode, a source electrode, and a drain electrode; a planarization layer disposed on the substrate and on the source and drain electrodes, the planarization layer having a trench; a via hole disposed in the trench and for exposing a part of the source electrode or the drain electrode through the planarization layer; a first electrode connected with the part of the source electrode or the drain electrode through the via hole and having opposite ends disposed in the trench; a pixel defining layer disposed on the first electrode and having an opening for exposing the first electrode; an organic layer disposed in the opening and including at least an emission layer; and a second electrode disposed on the substrate and on the organic layer.

In another exemplary embodiment of the present invention, a method of fabricating an organic light emitting display device includes: preparing a substrate; forming a thin film transistor including a semiconductor layer, a gate insulating layer, a gate electrode, a source electrode, and a drain electrode on the substrate; forming a planarization layer on the substrate including the source and drain electrodes; etching the planarization layer and forming a trench; forming a via hole exposing a part of the source or drain electrode through the planarization layer in the trench; forming a first electrode connected with the source or drain electrode through the via hole and having opposite ends in the trench; forming a pixel defining layer including an opening exposing the first electrode on the first electrode; forming an organic layer including at least an organic emission layer in the opening; and forming a second electrode on the entire surface of the substrate including the organic layer.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
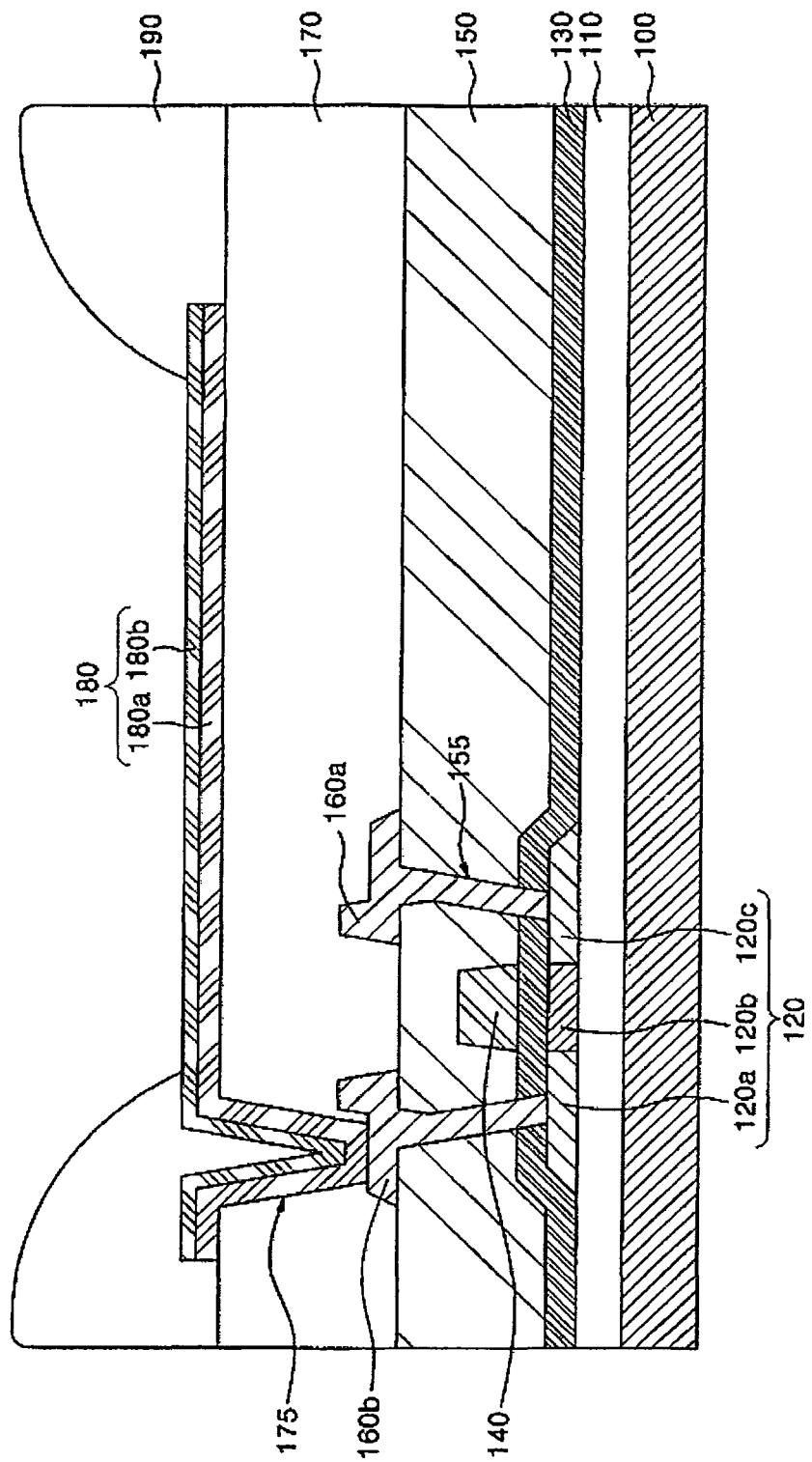
FIG. 1 is a cross-sectional view of a conventional organic light emitting display device.
Figure 2:
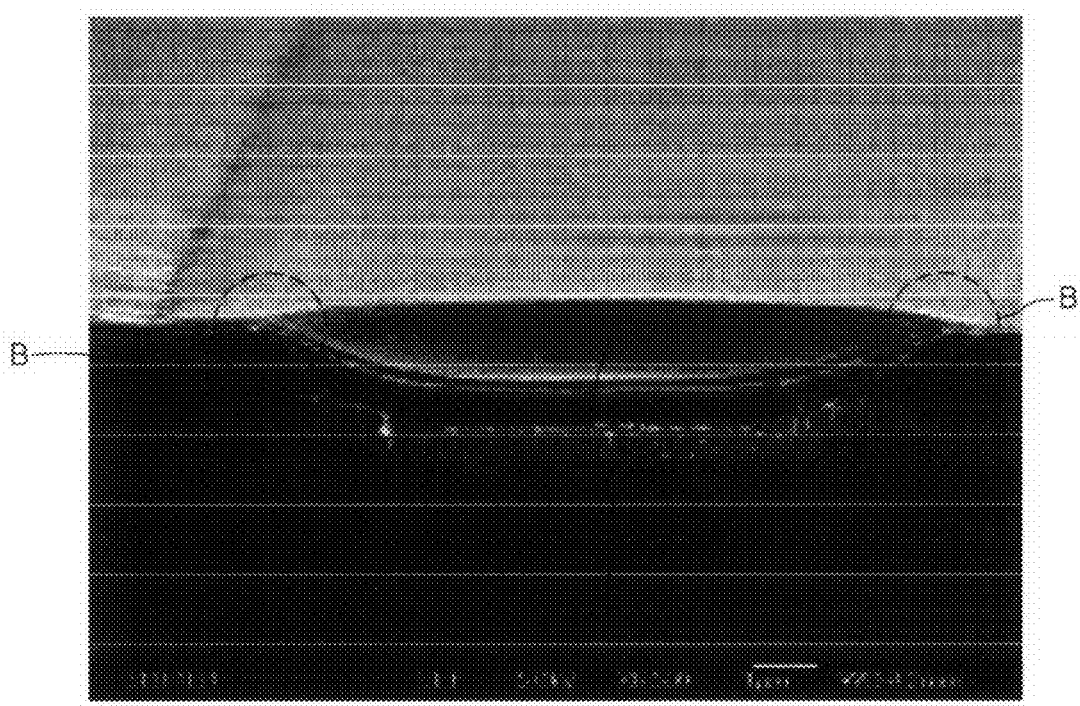
FIG. 2 is a photograph of an area surrounding a via hole after a pixel defining layer is formed to a thickness of 2000 Å using an organic material.
Figure 3:
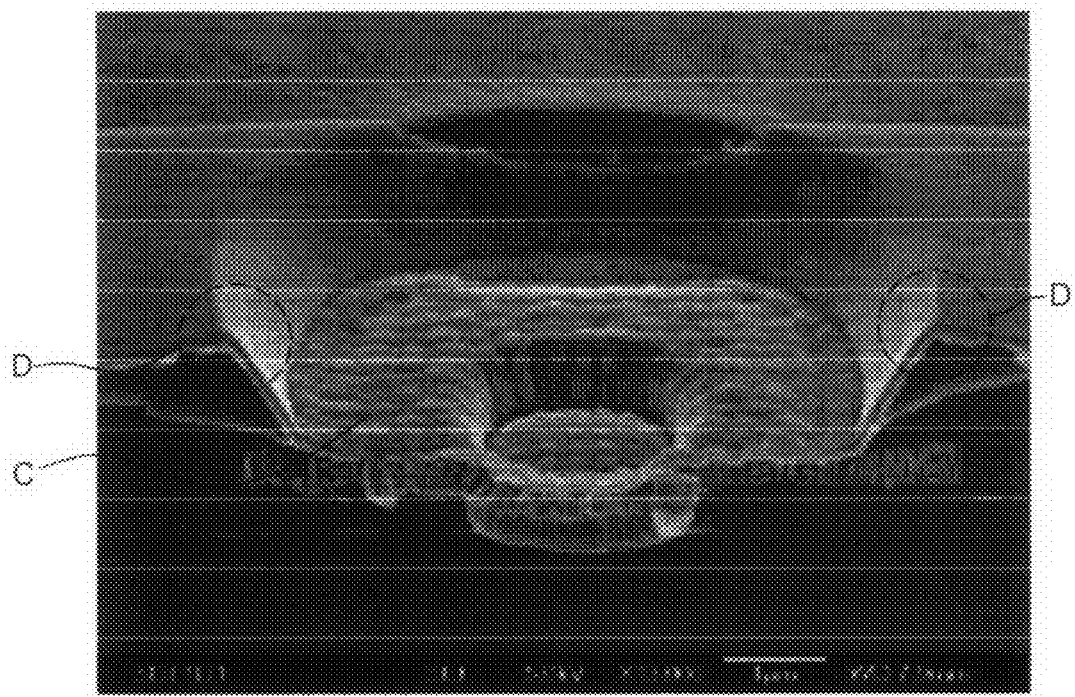
FIG. 3 is a photograph of an area surrounding a via hole after a pixel defining layer is formed to a thickness of about 1000 Å using an inorganic material.

In the following detailed description, only certain exemplary embodiments of the present invention are shown and described, by way of illustration. As those skilled in the art would recognize, the invention may be embodied in many different forms and should not be construed as being limited to the embodiments set forth herein. Also, in the context of the present application, when an element is referred to as being "on" another element, it can be directly on the another element or be indirectly on the another element with one or more intervening elements interposed therebetween. Like reference numerals designate like elements throughout the specification.

Exemplary Embodiments

Figure 4:
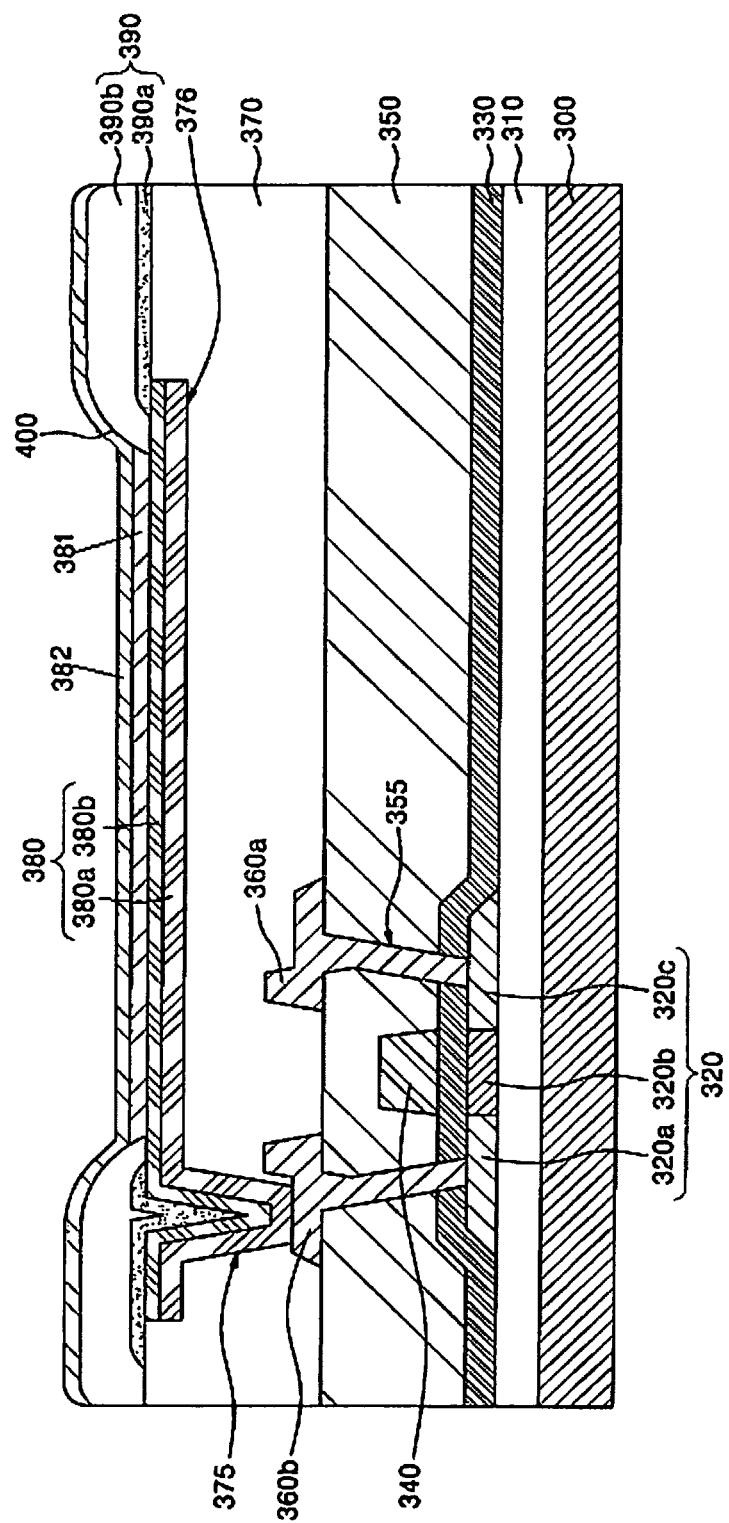
FIG. 4 is a cross-sectional view of an organic light emitting display device according to an exemplary embodiment of the present invention.

FIG. 4 is a cross-sectional view of an organic light emitting display device according to an exemplary embodiment of the present invention. In one embodiment, the organic light emitting display includes an organic light emitting diode (OLED).

Referring to FIG. 4, a buffer layer 310 is formed on a substrate 300 formed of glass, plastic and/or a conductive metal. The buffer layer 310 protects a thin film transistor formed in a following process from impurities, such as alkali ions leaked from the substrate 300, and is selectively formed of silicon oxide ($SiO_2$), silicon nitride ($SiN_x$) and so on.

A semiconductor layer 320 having source and drain regions 320a and 320c and a channel region 320b between the source and drain regions 320a and 320c is formed on the buffer layer 310. The semiconductor layer 320 may be a polycrystalline silicon layer which is formed by crystallizing an amorphous silicon layer formed on the buffer layer 310 using Excimer Laser Annealing (ELA), Sequential Lateral Solidification (SLS), Metal Induced Crystallization (MIC), Metal Induced Lateral Crystallization (MILC), and/or Super Grained Silicon (SGS), and then patterning the crystallized result.

A gate insulating layer 330 is formed on the substrate 300 and on the semiconductor layer 320. The gate insulating layer 330 may be a silicon oxide layer, a silicon nitride layer, or combinations thereof.

A gate electrode 340 is formed in a region (which may be predetermined) of the gate insulating layer 330 corresponding to the semiconductor layer 320. The gate electrode 340 may be formed of at least one material selected from the group consisting of aluminum (Al), an Al alloy, molybdenum (Mo), a Mo alloy, and, in one embodiment, a molybdenum-tungsten (MoW) alloy.

An interlayer insulating layer 350 is formed on a surface of the substrate 300 including the gate electrode 340. The interlayer insulating layer 350 is a silicon nitride layer and/or a silicon oxide layer and is for insulating source and drain electrodes 360a and 360b, which will be formed after the gate electrode 340.

The interlayer insulating layer 350 and the gate insulating layer 340 are etched to form contact holes 355 for exposing parts of the source and drain regions 320a and 320c.

Source and drain electrodes 360a and 360b are formed to be electrically connected with the source and drain regions 320a and 320c through the contact holes 355. The source and drain electrodes 360a and 360b are formed of a low resistance material to reduce interconnection resistance, e.g., metal such as Mo, W, MoW, Al, etc.

Figure 6:
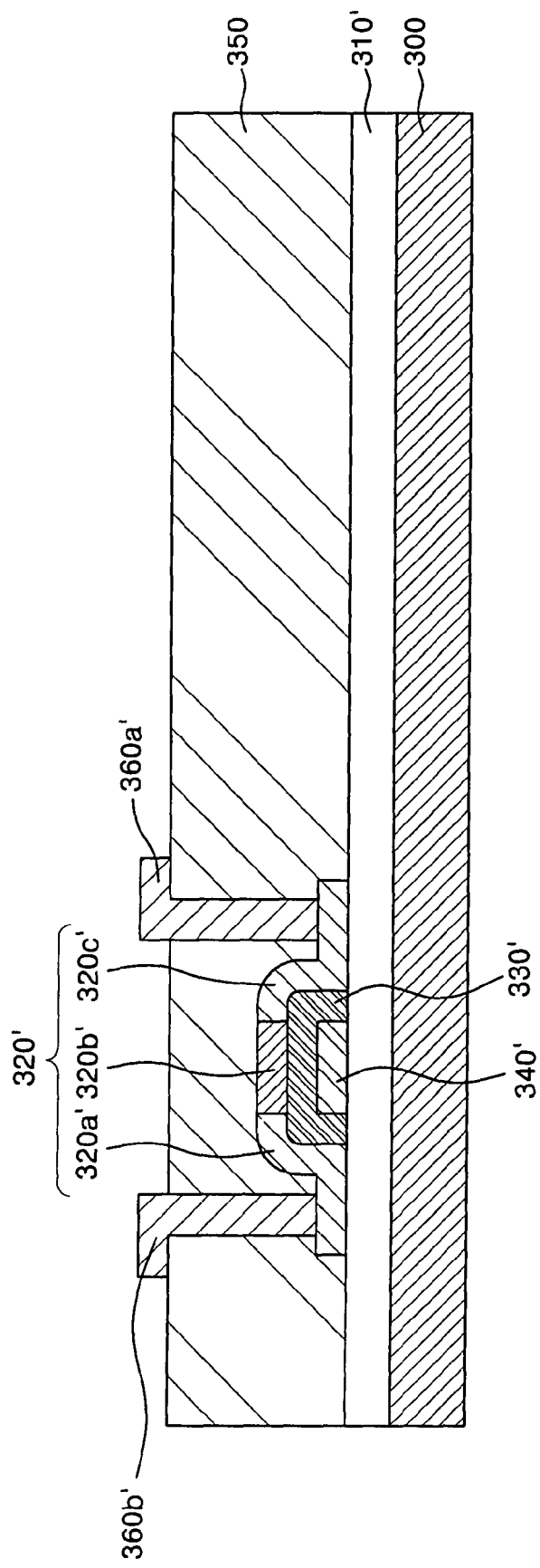
FIG. 6 is a cross-sectional view of a portion of an organic light emitting display device according to an exemplary embodiment of the present invention.

Through the above process, a thin film transistor is fabricated to include the semiconductor layer 320, the gate insulating layer 330, the gate electrode 340, the interlayer insulating layer 350, and source and drain electrodes 360a and 360b. In the embodiment of FIG. 4, the thin film transistor is formed to have a top gate structure. However, the thin film transistor may alternatively be formed to have a bottom gate structure in which the gate electrode, the gate insulating layer, the semiconductor layer, and the source and drain electrodes are stacked sequentially. For example, referring to FIG. 6, a thin film transistor is disposed on a substrate 300'. As shown in FIG. 6, the thin film transistor includes a gate electrode 340', a gate insulating layer 330', a semiconductor layer 320', and source and drain electrodes 360a' and 360b' that are sequentially stacked (or sequentially stacked one after another). Here, the semiconductor layer 320 is shown to be disposed on a buffer layer 310' and to include source and drain regions 320a' and 320c' and a channel region 320b' between the source and drain regions 320a' and 320c'

Referring back to FIG. 4, a planarization layer 370 is formed on the substrate 300 and on the source and drain electrodes 360a and 360b. The planarization layer 370 may be formed to a thickness from about 0.5 to 1 μm using an organic material such as polyimide, benzocyclobutene, acrylate (or polyacryl), etc., or using an inorganic material such as spin on glass (SOG) in which liquid silicon oxide is coated, cured, and hardened.

The planarization layer 370 is etched to form a trench 376 defining a region of the planarization layer 370 in which a first electrode will be formed. As compared with a conventional organic light emitting display, the trench 376 reduces a height difference between the planarization layer 370 and a first electrode 380. Thus, the depth of the trench 376 may correspond to the thickness of the first electrode 380 or at least from ½ to 3/2 the thickness of the first electrode 380.

Here, in one embodiment, if the depth of the trench 376 is less than half the thickness of the first electrode 380, a considerably large area of the first electrode 380 protrudes out of the planarization layer 370, causing a pixel defining layer to be too thick. By contrast, in another embodiment, if the depth of the trench 376 is greater than 3/2 the thickness of the first electrode 380, a pixel defining layer may be thin, but the first electrode 380 is formed too deeply into the planarization layer 370 so that a transfer efficiency in fabricating the organic layer by LITI decreases.

The planarization layer 370 is etched to form a via hole 375 for exposing a part of the drain electrode 360a in the trench 376. The via hole 375 may be formed concurrently (or simultaneously) with the trench 376 by a halftone mask process. Then, the first electrode 380 connected with the drain electrode 360a through the via hole 375 is formed to have opposite ends in (or within) the trench 376.

The first electrode 380 may be an anode, and when forming a top emission structure, may include a reflective metal layer 380a and a transparent conductive layer 380b. The reflective metal layer 380a may be formed of metal having high reflectance such as Al, aluminum-neodymium (AlNd), silver Ag, Ag alloy, etc. Here, the reflective metal layer 380a may be formed to a thickness from 500 to 2000 Å in order to have a proper reflective property. In one embodiment, if the reflective metal layer 380a is thinner than 500 Å, it is difficult to have a proper reflective property. By contrast, in another embodiment, if the reflective metal layer 380a is thicker than 2000 Å, its layer stress increases, thereby reducing adhesion between the reflective metal layer 380a and the transparent conductive layer 380b that will be formed later.

The transparent conductive layer 380b may be formed of Indium Tin Oxide (ITO) and/or Indium Zinc Oxide (IZO), to a thickness from 50 to 200 Å, on the reflective metal layer 380a. In one embodiment, if the transparent conductive layer 380b is thinner than 50 Å, its evenness is difficult to ensure and thus the reflective metal layer 380a disposed under the transparent conductive layer 380a may be exposed, thereby causing a dark pixel defect. By contrast, in another embodiment, if the transparent conductive layer 380b is thicker than 200 Å, the reflectance of a blue emission layer may be reduced due to an interference effect.

Here, when the organic light emitting display device is formed to have a bottom emission structure, the first electrode 380 may be a transparent conductive layer formed of ITO, IZO, Indium Cerium Oxide (ICO) and/or Zinc Oxide (ZnO).

Also, the first electrode 380 may be a cathode. Here, when the organic light emitting display device is formed to have an inverted top emission structure, the first electrode 380 may be a single metal layer formed of Mg, Ag, Al, and/or Ca.

As such, the first electrode 380 is formed to have opposite ends in (or within) the trench 376, thereby reducing a height difference between the planarization layer 370 and the first electrode 380. Also, the first electrode 380 does not protrude onto (or too much onto) the planarization layer 370, thereby reducing the thickness of a pixel defining layer that will be formed later.

As shown in FIG. 4, a pixel defining layer 390 is formed on the first electrode 380. The pixel defining layer 390 may be formed of an organic layer using polyimide, acrylate, etc. Then, the pixel defining layer 390 is patterned to form an opening 400 for exposing the first electrode 380.

Alternatively, the pixel defining layer 390 may be formed of an inorganic layer, or be formed of a multilayer having a stack of at least one pair of an organic layer and an inorganic layer.

The pixel defining layer 390 may include a first inorganic pixel defining layer 390a and a second organic pixel defining layer 390b. The first pixel defining layer 390a is thinly formed to a thickness from 500 to 1000 Å on the first electrode 390 using silicon nitride and/or silicon oxide. In one embodiment, when the first pixel defining layer 390a is thinner than 500 Å, if the second pixel defining layer 390b gets damaged, a short circuit between the first and second electrodes may not be prevented (or blocked). By contrast, in another embodiment, when the first pixel defining layer 390a is thicker than 1000 Å, many cracks are generated due to increased layer stress, and efficiency of organic layer transfer by an LITI method may be reduced because the total thickness of the pixel defining layer is increased.

The first pixel defining layer 390a is etched to form an opening 400 for exposing the first electrode 390a, and then the second pixel defining layer 390b is formed on the first defining layer 390a. The second pixel defining layer 390b is formed to a thickness from 1000 to 3000 Å using an organic material such as acryl (or polyacryl) that has excellent filling ability, and/or polyimide. The second pixel defining layer 390b may be patterned by exposing and developing. The second defining layer 390b fills the via hole 375 and buries cracks in an edge of the first electrode and around the via hole due to low step coverage of the first inorganic pixel defining layer 390*a*, thus preventing (or blocking) a short circuit between the first and second electrodes. In one embodiment, if the second pixel defining layer 390*b* is thinner than 1000 Å, it may not fully fill the via hole 375. In another embodiment, if the second pixel defining layer 390*b* is thicker than 3000 Å, the total thickness of the pixel defining layer becomes too thick, which may deteriorate transfer efficiency when the organic layer is transferred by the LITI method.

Here, the pixel defining layer 390 including the first inorganic pixel defining layer 390*a* and the second organic pixel defining layer 390*b* may make up for shortcomings in an inorganic layer (alone) and/or an organic layer (alone), and can be thinner than a single layered pixel defining layer. Thus, when an organic layer is formed by the LITI method, thermal damage of the organic layer may be reduced (or prevented), and transfer efficiency may be improved.

In addition, an organic layer is formed in the opening 400. The organic layer includes at least an organic emission layer, and may further include at least one of a hole injection layer, a hole transport layer, an electron transport layer, or an electron injection layer.

The at least one of the hole injection layer, the hole transport layer, the electron transport layer, or the electron injection layer may be formed by the LITI method, and as described above, a height difference between the pixel defining layer and the first electrode may be made small in order to increase transfer efficiency.

Then, a second electrode 382 is formed on the organic layer 381 (or a surface of the substrate 300 including the organic layer 381). In the exemplary embodiment of the present invention, the second electrode 382 may be a cathode, and may be either a transparent electrode or a reflective electrode, using Mg, Ag, Al, and/or Ca. Also, the second electrode 382 may include a thin metal layer and a transparent conductive layer.

Alternatively, the second electrode may be an anode formed of a transparent conductive layer of ITO, IZO, ICO and/or ZnO.

The resultant structure fabricated as above is sealed with an encapsulation substrate (or layer) formed of glass, plastic or a conductive metal, and thus an OLED is completed.

As described above, the first electrode 380 is formed to have opposite ends in (or within) the trench 376 of the planarization layer 370 so as to reduce the height difference between the first electrode 380 and the insulating layer 370, and thus a thinner pixel defining layer than the conventional one may be formed. As a result, when the organic layer is formed by the LITI method, thermal damage of the organic layer may be reduced (or prevented) and transfer efficiency may be improved.

Further, since the pixel defining layer including the first pixel defining layer (or the first inorganic pixel defining layer) 390*a* and the second pixel defining layer (or the second organic pixel defining layer) 390*b* is formed on the first electrode 380, cracks due to poor step coverage of the first pixel defining layer 390*a* may be entirely covered with the second pixel defining layer 390*b*. Also, even if the second pixel defining layer 390*b* is damaged during removal of a donor substrate after the organic layer is transferred, a short circuit between the first and second electrodes can be prevented (or blocked) due to the first inorganic pixel defining layer 390*a* disposed under the second pixel defining layer 390*b*.

Also, since the thickness of the first pixel defining layer 390*a* is from 500 to 1000 Å, and the thickness of the second pixel defining layer 390*b* is from 1000 to 3000 Å, the pixel defining layer formed as above may be thinner than the conventional pixel defining layer formed of an organic material (only). Thus, transfer efficiency may be increased (or maximized) in formation of the organic layer by the LITI method.

The following examples illustrate the present invention in more detail. However, the present invention is not limited by these examples.

EXPERIMENTAL EXAMPLE

A planarization layer was formed to a thickness of 1 μm using SOG on a substrate having a substructure (which may be predetermined). A trench was formed to a thickness of about 1000 Å on the planarization layer, and a first electrode including a 1000 Å-thick reflective metal layer and a 70 Å-thick transparent conductive layer was formed to have opposite ends in the trench. A pixel defining layer was formed to a thickness of 2000 Å using polyimide on the first electrode. Then, the pixel defining layer was patterned so as to form an opening for exposing the first electrode.

An organic layer was formed by an LITI method in the opening. A second electrode was formed on the entire surface of the substrate including the organic layer, and thus an organic light emitting display device was completed.

COMPARATIVE EXAMPLE 1

A planarization layer was formed to a thickness of 1 μm using SOG on a substrate having a substructure (which may be predetermined). A first electrode including a reflective metal layer and a transparent conductive layer was formed on the planarization layer. Then, a pixel defining layer was formed to a thickness of about 2000 Å using polyimide on the first electrode. Except for these steps, an organic light emitting display device was fabricated by substantially the same procedures as in the Experimental Example.

COMPARATIVE EXAMPLE 2

A planarization layer was formed to a thickness of 1 μm using SOG on a substrate having a substructure (which may be predetermined). A first electrode including a reflective metal layer and a transparent conductive layer was formed on the planarization layer. Then, a pixel defining layer was formed to a thickness of about 1000 Å using silicon nitride on the first electrode. Except for these steps, an organic light emitting display device was fabricated by substantially the same procedures as in the Experimental Example.

Figure 5A:
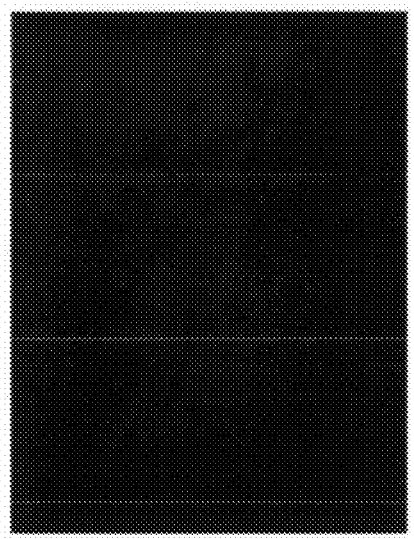
FIGS. 5A, 5B, and 5C are photographs of a lighted screen of organic light emitting display devices fabricated according to Comparative Examples 1 and 2, and an Experimental Example.
Figure 5B:
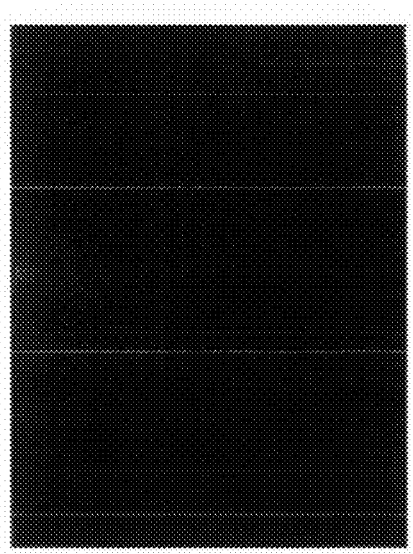
Figure 5C:
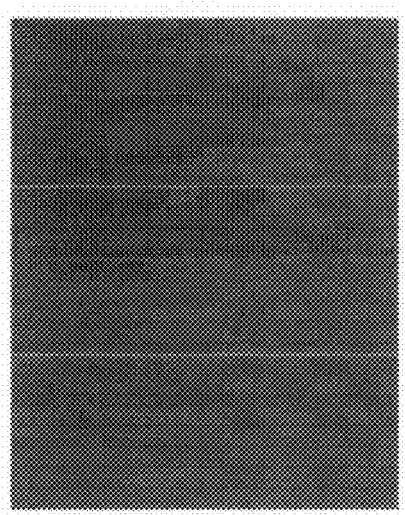

FIGS. 5A to 5C are photographs of a lighted screen of the organic light emitting display devices fabricated according to the Comparative Examples 1 and 2, and the Experimental Example.

FIG. 5A shows a lighted screen of the organic light emitting display device according to the Comparative Example 1. It can be seen that screen quality is poor due to unevenness in the organic pixel defining layer and dark pixels caused by damage to the organic layer in the fabrication of the organic layer by LITI.

FIG. 5B shows a lighted screen of the organic light emitting display device according to the Comparative Example 2. It can be seen that the screen looks stained due to dark pixels caused by cracks generated around the via hole and at the edge of the first electrode.

FIG. 5C shows a lighted screen of an organic light emitting display device according to the Experimental Example. When opposite ends of the first electrode are formed in a trench according to the present invention, the thickness of the pixel defining layer may be reduced, thereby increasing efficiency in transfer of the organic layer by the LITI method, and obtaining a clear lighted screen as can be seen from FIG. 5C.

Consequently, the present invention can increase (or maximize) transfer efficiency of the organic layer by LITI and reduce (or prevent) thermal damage of the organic layer and open defects, thereby improving the reliability of a device.

While the invention has been described in connection with certain exemplary embodiments, it will be appreciated by those skilled in the art that the invention is not limited to the disclosed embodiments, but, on the contrary, is intended to cover various modifications included within the principles and spirit of the invention, the scope of which is defined in the claims and their equivalents.

What is claimed is:

1. An organic light emitting display device, comprising:
   a substrate;
   a thin film transistor disposed on the substrate and including a semiconductor layer, a gate insulating layer, a gate electrode, a source electrode, and a drain electrode;
   a planarization layer disposed on the substrate and on the source and drain electrodes, the planarization layer having a trench;
   a via hole disposed in the trench, the via hole exposing a part of the source electrode or the drain electrode through the planarization layer;
   a first electrode connected with the part of the source electrode or the drain electrode through the via hole and having opposite ends disposed in the trench;
   a pixel defining layer disposed on the first electrode, and comprising a first pixel defining layer contacting the first electrode and partially filling the trench, and a second pixel defining layer contacting the first electrode and partially filling the trench, and having an opening for exposing the first electrode, the pixel defining layer overlapping at least a portion of the trench;
   an organic layer disposed in the opening and including at least an emission layer; and
   a second electrode disposed on the substrate and on the organic layer.

2. The organic light emitting display device according to claim 1, wherein a depth of the trench is from about ½ to about 3/2 of a thickness of the first electrode.

3. The organic light emitting display device according to claim 1, wherein the planarization layer is an organic layer.

4. The organic light emitting display device according to claim 3, wherein the planarization layer is formed of at least one material selected from the group consisting of polyimide, polyacryl, benzocyclobutene, and combination thereof.

5. The organic light emitting display device according to claim 1, wherein the planarization layer is an inorganic layer.

6. The organic light emitting display device according to claim 5, wherein the planarization layer is formed of SOG.

7. The organic light emitting display device according to claim 1, wherein the pixel defining layer is an organic layer.

8. The organic light emitting display device according to claim 1, wherein the pixel defining layer has a stack structure comprising at least one pair of an organic layer and an inorganic layer.

9. The organic light emitting display device according to claim 8, wherein:
   the first pixel defining layer comprises an inorganic pixel defining layer; and
   the second pixel defining layer comprises an organic pixel defining layer disposed on the first pixel defining layer.

10. The organic light emitting display device according to claim 9, wherein the second pixel defining layer covers the via hole and is disposed on the first pixel defining layer to surround a circumference of the via hole and an edge of the first electrode.

11. The organic light emitting display device according to claim 9, wherein the first pixel defining layer is formed to a thickness from about 500 to about 1000 Å.

12. The organic light emitting display device according to claim 9, wherein the second pixel defining layer is formed to a thickness from about 1000 to about 3000 Å.

13. The organic light emitting display device according to claim 8, wherein the inorganic layer is formed of at least one material selected from the group consisting of silicon nitride, silicon oxide, and combinations thereof.

14. The organic light emitting display device according to claim 1, wherein the first electrode comprises a reflective metal layer and a transparent conductive layer disposed on the reflective metal layer.

15. The organic light emitting display device according to claim 14, wherein the reflective metal layer is formed of at least one material selected from the group consisting of Al, an Al alloy, Ag, and an Ag alloy.

16. The organic light emitting display device according to claim 14, wherein the reflective metal layer is formed to a thickness from about 500 to about 2000 Å.

17. The organic light emitting display device according to claim 14, wherein the transparent conductive layer is formed to a thickness from about 50 to about 200 Å.

18. The organic light emitting display device according to claim 14, wherein the transparent conductive layer is formed of at least one material selected from the group consisting of ITO, IZO, ICO, and ZnO.

19. The organic light emitting display device according to claim 1, wherein the first electrode is formed of a transparent conductive layer.

20. The organic light emitting display device according to claim 1, wherein the first electrode is formed of at least one material selected from the group consisting of Mg, Ag, Al, Ca, and alloys thereof.

21. The organic light emitting display device according to claim 1, wherein the organic layer further comprises at least one layer selected from the group consisting of a hole injection layer, a hole transport layer, an electron transport layer, and an electron injection layer.

22. The organic light emitting display device according to claim 1, wherein the second electrode is formed of a least one material selected from the group consisting of Mg, Ag, Al, Ca, and alloys thereof.

23. The organic light emitting display device according to claim 1, wherein the second electrode comprises a transparent conductive layer.

24. The organic light emitting display device according to claim 1, wherein the semiconductor layer, the gate insulating layer, the gate electrode, an interlayer insulating layer, the source electrode, and the drain electrode are sequentially stacked.

25. The organic light emitting display device according to claim 1, wherein the gate electrode, the gate insulating layer, the semiconductor layer, the source electrode, and the drain electrode are sequentially stacked.

* * * * *